United States Patent
Parks

(10) Patent No.: US 7,964,840 B2
(45) Date of Patent: Jun. 21, 2011

(54) HIGH DYNAMIC RANGE IMAGE SENSOR INCLUDING POLARIZER AND MICROLENS

(75) Inventor: Christopher Parks, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 209 days.

(21) Appl. No.: 12/141,993

(22) Filed: Jun. 19, 2008

(65) Prior Publication Data

US 2009/0314928 A1    Dec. 24, 2009

(51) Int. Cl.
*G02F 1/01* (2006.01)
*H01L 27/00* (2006.01)

(52) U.S. Cl. .................................. 250/225; 250/208.1

(58) Field of Classification Search ............... 250/208.1, 250/225, 216, 221; 257/290–292, 257, 258, 257/294, 431–437, 443, 451; 348/294, 302, 348/311, 315, 335
See application file for complete search history.

(56) References Cited

U.S. PATENT DOCUMENTS

| | | | |
|---|---|---|---|
| 3,919,587 A | 11/1975 | Sato et al. | |
| 5,164,831 A | 11/1992 | Kuchta et al. | |
| 5,416,324 A * | 5/1995 | Chun | 250/341.3 |
| 5,438,414 A * | 8/1995 | Rust | 356/364 |
| 5,767,507 A | 6/1998 | Unlu et al. | |
| 6,069,377 A | 5/2000 | Prentice et al. | |
| 6,777,661 B2 | 8/2004 | Summa et al. | |
| 6,806,452 B2 * | 10/2004 | Bos et al. | 250/208.1 |
| 7,538,805 B2 * | 5/2009 | Kubo | 348/251 |
| 7,582,857 B2 * | 9/2009 | Gruev et al. | 250/225 |
| 2008/0029701 A1 * | 2/2008 | Onozawa et al. | 250/332 |

FOREIGN PATENT DOCUMENTS

| | | |
|---|---|---|
| EP | 1 079 613 A2 | 2/2001 |
| EP | 1 607 773 A1 | 12/2005 |

* cited by examiner

*Primary Examiner* — Georgia Y Epps
*Assistant Examiner* — Jennifer Bennett
(74) *Attorney, Agent, or Firm* — Blakely Sokoloff Taylor & Zafman LLP

(57) ABSTRACT

An image sensor includes a plurality of pixels, each pixel includes a first photosensitive region that collects charge in response to light and having a first sensitivity; a second photosensitive region that collects charge in response to light and having a second sensitivity that is lower than the sensitivity of the first photosensitive region; and a polarizer spanning the second photosensitive region.

21 Claims, 4 Drawing Sheets

HIGH DYNAMIC RANGE IMAGE SENSOR INCLUDING POLARIZER AND MICROLENS

FIELD OF THE INVENTION

The present invention generally relates to image sensors and, more particularly, to image sensors having two photosensitive regions. A polarizer covers one of the regions so that the saturation of the two portions is different to accommodate different lighting conditions.

BACKGROUND OF THE INVENTION

Image sensors that are used for cameras in automobiles need to have a dynamic range more than 5 times greater than standard image sensors. This is because direct or reflected sunlight obscures detail in shadows. To image detail in shadows and highlight conditions, several different methods have been used. One method, such as U.S. Pat. No. 3,919,587, uses pixels with photodiodes having a non-linear photo-response. In another method, U.S. Pat. No. 6,777,661 uses pixels having two photosensitive regions with high light and low light photo-response. Finally, U.S. Pat. No. 6,069,377 uses a timer to measure the time it takes to reach saturation and reads out this time out along with the measured charge.

The disadvantage of the prior art is that reflected sunlight, especially from a wet road surface, can be so bright that image sensors with more than 10 times normal dynamic range are still not sufficient to image objects in reflected sunlight and shadows.

FIG. 1 illustrates light being reflected from a road surface. The electric field vector of the light incident upon the road surface is randomly polarized. The light has approximately equal electric fields that are parallel and perpendicular to the road plane of incidence. After reflection, the light has strong polarization with the electric field vector parallel to the plane of incidence (the road surface). It is noted that sunglasses are often designed with a polarizer to filter out light with the electric field vector parallel to the road surface.

A camera could place a polarizer in front of the image sensor, but this is undesirable because of the extra cost, and it removes 50% of the light from low light shadows.

The present invention provides an image sensor capable of selectively rejecting sunlight reflected from road surfaces while allowing light from other objects to be imaged. The present invention also integrates the polarizer with the image sensor.

SUMMARY OF THE INVENTION

According to one aspect of the present invention, the invention includes an image sensor comprising a plurality of pixels, each pixel comprising a first photosensitive region that collects charge in response to light and having a first sensitivity; a second photosensitive region that collects charge in response to light and having a second sensitivity that is lower than the sensitivity of the first photosensitive region; and a polarizer spanning the second photosensitive region.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECTS OF THE INVENTION

The present invention has the advantages of having an image sensor that selectively rejects sunlight, an integrated polarizer and minimizes cost.

DETAILED DESCRIPTION OF THE INVENTION

Figure 1:
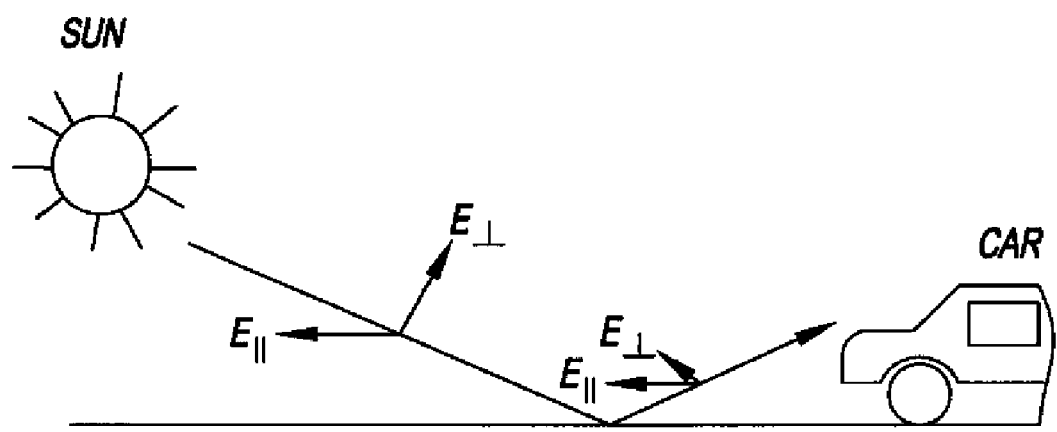
FIG. 1 is an illustration of reflected sunlight off a road surface.
Figure 2:
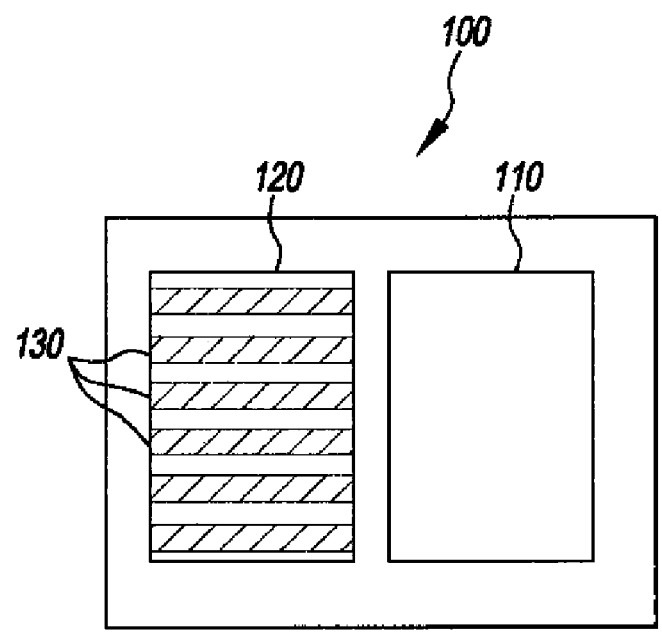
FIG. 2 depicts a pixel of the image sensor of the present invention.

FIG. 2 shows a pixel 100 of the present invention having two photosensitive regions 110 and 120, each of which collect charge in response to incident light. One photosensitive region 110 has high quantum efficiency so it can detect light from dark shadows, and one photosensitive region 120 has low quantum efficiency. If the light is too bright and saturates the high quantum efficiency photosensitive region 110, then the signal is measured from the low sensitivity region 120.

Figure 3:
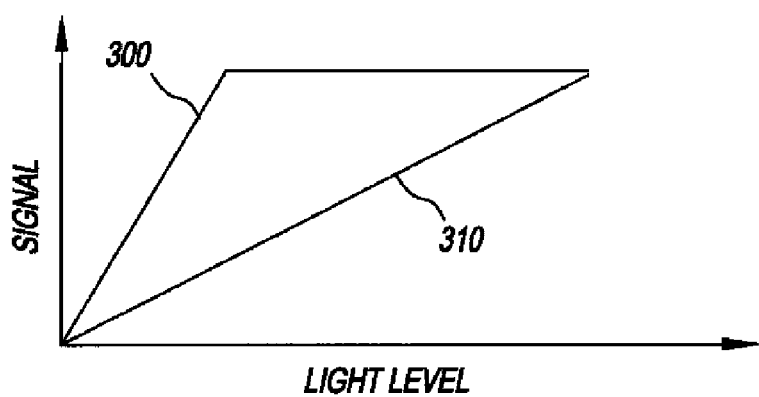
FIG. 3 is a graph illustrating saturation of each of the two photosensitive regions of FIG. 2.

FIG. 3 shows the photo-response of the high sensitivity region 300 (photosensitive region 110) compared to the low sensitivity region 310 (photosensitive region 120). It is noted that curve 310 reaches saturation at a much higher light level than curve 300.

Referring back to FIG. 2, the photosensitive region 120 includes an integrated wire grid polarizer 130 for extending the dynamic range. The polarizer 130 prevents the extremely bright, reflected road surface light from saturating the low sensitivity region 120. Wires spaced apart less than one wavelength, attenuate light having an electric field polarized parallel to the length of the wire. Light having an electric field polarized perpendicular to the wire pass through more easily. The wire grid polarizer 130 is oriented in the horizontal direction (parallel or substantially parallel to the road surface) to prevent the road surface reflection from being detected by the low sensitivity region 120.

Figure 4:
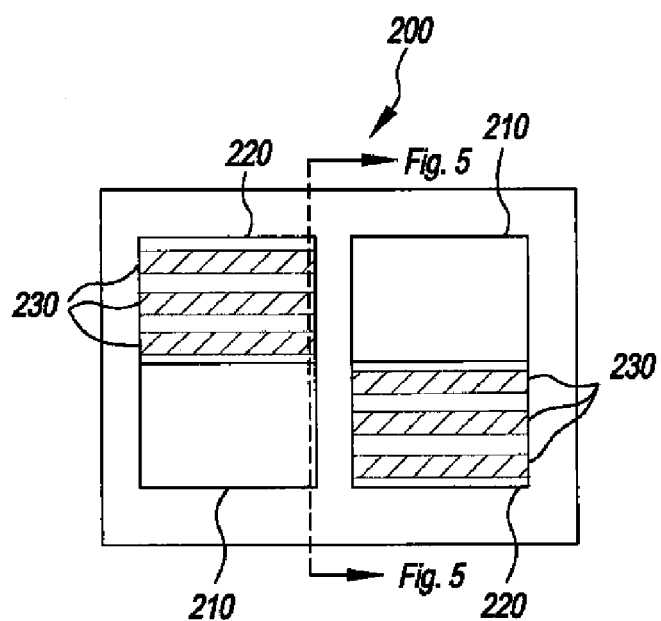
FIG. 4 is an alternative embodiment of the present invention.

FIG. 4 shows a pixel 200 with an alternate embodiment. The pixel 200 includes two distinct high sensitivity regions 210 and two distinct low sensitivity regions 220, each of which regions 210 and 220 collect charge in response to incident light. A wire grid polarizer 230 covers both low sensitivity regions 220 each having equal or substantially equal sensitivity. The high sensitivity regions 210 also have equal or substantially equal sensitivity. The two regions 210 and 220 are positioned diagonal to each other to reduce image artifacts if a vertical line is imaged upon the pixel.

Figure 5:
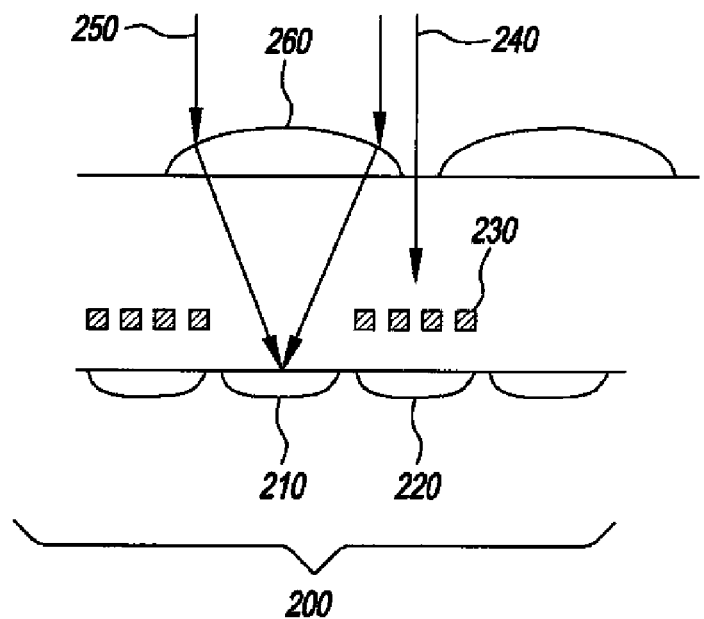
FIG. 5 is a cross-sectional drawing of FIG. 4.

FIG. 5 shows a cross section through the pixel 200 of FIG. 4. A micro-lens 260 covers the high sensitivity region 210 and partially covers each of the two low sensitivity regions 220. It is noted for clarity that one of the low sensitivity regions 220 is from an adjacent pixel. This directs most of the light 250 towards the high sensitivity region 210 and allows a smaller fraction of light 240 to reach the low sensitivity region 220.

This is what makes the low sensitivity region 220 have less sensitivity. In addition, the wire grid polarizer 230 filters out light 240 that has been polarized by reflection from a road surface. The configuration of the microlens covering the high sensitivity region and partially covering the low sensitivity region also applies to the embodiment of FIG. 2. In this embodiment, as in the alternative embodiment, one of the low sensitivity regions 120 is from an adjacent pixel.

Figure 6:
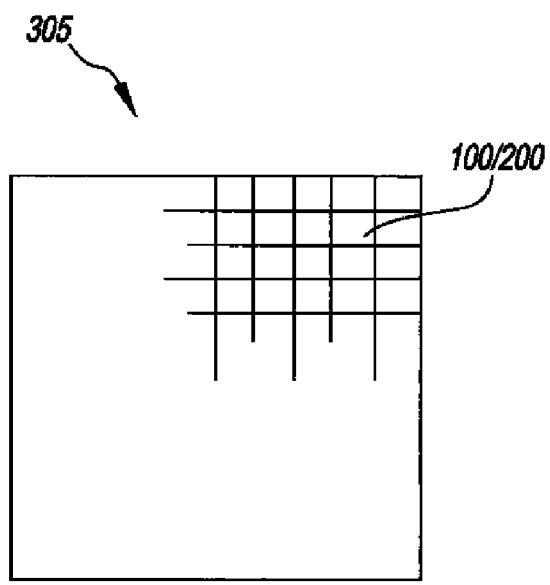
FIG. 6 is a top view of an image sensor of the present invention.

FIG. 6 is a top view of the image sensor 305 of the present invention having a plurality of pixels 100 and/or 200. The pixels 100 and/or 200 are arranged in a two-dimensional array, but they may also be arranged in a one-dimensional array (i.e., linear array). The image sensor 305 may be either a charge-coupled device image sensor or a CMOS image sensor, both of which are well known in the art.

Figure 7:
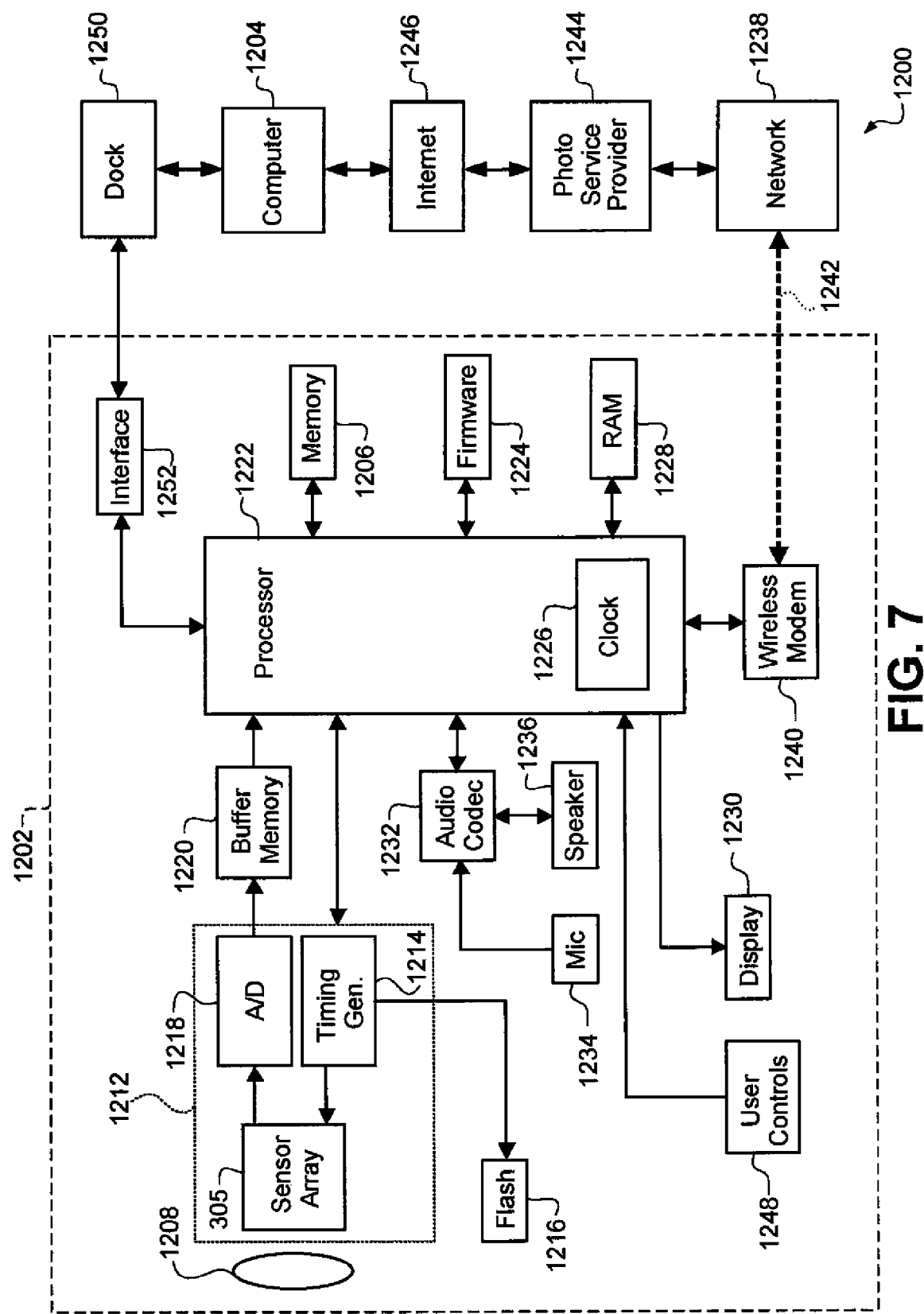
FIG. 7 is an image capture system having the image sensor of the present invention.

FIG. 7 is a block diagram of an imaging system that can be used with the image sensor 305 of the present invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses lens 1208 to focus light from a scene (not shown) onto image sensor 305 of imaging integrated circuit 1212. Image sensor 305 provides color image information using the Bayer color filter pattern in an embodiment in accordance with the invention. Image sensor 305 is controlled by timing generator 1214, which also controls flash 1216 in order to illuminate the scene when the ambient illumination is low.

The analog output signals output from the image sensor array 305 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage of Full and Reduced Resolution Images" to Kuchta, et al. The thumbnail image is stored in RAM memory 1228 and supplied to color display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor 305 together (e.g. summing pixels of the same color within each 4 column×4 row area of the image sensor array 305) to create a lower resolution video image frame. The video image frames are read from image sensor array 305 at regular intervals, for example, using a 15 frame per second readout rate.

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on color display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1250 recharges the batteries (not shown) in digital camera phone 1202. Dock 1250 connects digital camera phone 1202 to computing device 1204 via dock interface 1252. Dock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described in detail with particular reference to certain preferred embodiments thereof, but it will be understood that variations and modifications can be effected within the spirit and scope of the invention.

PARTS LIST 100 pixel
110 photosensitive region
120 photosensitive region
130 polarizer
200 pixel
210 high sensitivity region
220 low sensitivity region
230 polarizer
240 light
250 light
260 micro-lens
300 high sensitivity region
305 image sensor
310 low sensitivity region
1200 imaging system
1202 digital camera phone
1204 computing device
1206 memory
1208 lens
1212 imaging integrated circuit
1214 timing generator
1216 flash
1218 A/D converter circuit
1220 buffer memory
1222 digital processor
1224 firmware memory
1226 clock
1228 RAM memory
1230 color display
1232 audio codec
1234 microphone
1236 speaker
1238 mobile phone network
1240 wireless modem
1242 RF Channel
1244 photo service provider
1246 Internet
1248 user controls
1250 dock
1252 dock interface

The invention claimed is:

1. An image sensor comprising:
a plurality of pixels-with at least one pixel comprising:
a first photosensitive region that collects charge in response to light and having a first sensitivity and a second photosensitive region that collects charge in response to light and having a second sensitivity that is lower than the sensitivity of the first photosensitive region;
a polarizer spanning only the second photosensitive region and not the first photosensitive region; and
a first microlens covering the first photosensitive region and only partially covering the second photosensitive region.

2. The image sensor as claim 1 wherein the polarizer is a wire grid polarizer.

3. The image sensor as in claim 1 wherein the polarizer is oriented to block light that is polarized by surface reflections.

4. The image sensor as in claim 1 further comprising a third photosensitivity region that collects charge in response to light and having a sensitivity that is substantially equal or equal to the first sensitivity, and a fourth photosensitive region that collects charge in response to light and having a sensitivity equal or substantially equal to the second sensitivity.

5. The image sensor as in claim 4 further comprising a second polarizer spanning the fourth photosensitive region.

6. The image sensor as in claim 5 wherein the second polarizer is a wire grid polarizer.

7. The image sensor as in claim 6 wherein the second polarizer is oriented to block light that is polarized by surface reflections.

8. The image sensor as in claim 5 wherein the first and third photosensitive regions are positioned diagonal to each other and the second and fourth photosensitive regions are positioned diagonal to each other within the at least one pixel.

9. The image sensor as in claim 8 further comprising a second microlens covering the third photosensitive region and only partially covering the fourth photosensitive region.

10. An image capture device comprising:
an image sensor comprising:
a plurality of pixels with at least one pixel comprising:
a first photosensitive region that collects charge in response to light and having a first sensitivity and a second photosensitive region that collects charge in response to light and having a second sensitivity that is lower than the sensitivity of the first photosensitive region;
a polarizer spanning only the second photosensitive region and not the first photosensitive region; and
a first microlens covering the first photosensitive region and only partially covering the second photosensitive region.

11. The image capture device as claim 10 wherein the polarizer is a wire grid polarizer.

12. The image capture device as in claim 10 wherein the polarizer is oriented to block light that is polarized by surface reflections.

13. The image capture device as in claim 10 further comprising a third photosensitivity region that collects charge in response to light and having a sensitivity that is substantially equal or equal to the first sensitivity, and a fourth photosensitive region that collects charge in response to light and having a sensitivity equal or substantially equal to the second sensitivity.

14. The image capture device as in claim 13 further comprising a second polarizer spanning the fourth photosensitive region.

15. The image capture device as in claim 14 wherein the second polarizer is a wire grid polarizer.

16. The image capture device as in claim 15 wherein the second polarizer is oriented to block light that is polarized by surface reflections.

17. The image capture device as in claim 14 wherein the first and second photosensitive regions are positioned diagonal to each other and the second and fourth photosensitive regions are positioned diagonal to each other within the at least one pixel.

18. The image capture device as in claim 17 further comprising a second microlens covering the third photosensitive region and only partially covering the fourth photosensitive region.

19. An image sensor comprising:
a plurality of pixels with at least one pixel comprising:

a first photosensitive region and a second photosensitive region that collect charge in response to light, wherein the first photosensitive region and the second photosensitive region are positioned diagonal to each other within the at least one pixel;

a third photosensitive region and a fourth photosensitive region that collect charge in response to light, wherein the third photosensitive region and the fourth photosensitive region are positioned diagonal to each other within the at least one pixel;

a first polarizer spanning only the third photosensitive region;

a second polarizer spanning only the fourth photosensitive region, wherein polarizers do not span the first and second photosensitive regions;

a first microlens covering the first photosensitive region and only partially covering the third photosensitive region, wherein the first microlens produces a first sensitivity in the first photosensitive region and a second sensitivity that is less than the first sensitivity in the third photosensitive region; and a second microlens covering the second photosensitive region and only partially covering the fourth photosensitive region, wherein the second microlens produces the first sensitivity in the second photosensitive region and the second sensitivity in the fourth photosensitive region.

20. The image sensor as in claim 19, wherein the microlens covering the first photosensitive region and only partially covering the third photosensitive region also only partially covers the third photosensitive region in an adjacent pixel.

21. The image sensor as in claim 19, wherein the microlens covering the second photosensitive region and only partially covering the fourth photosensitive region also only partially covers a fourth photosensitive region in an adjacent pixel.

* * * * *